(12) United States Patent
Kaida et al.

(10) Patent No.: US 11,437,256 B2
(45) Date of Patent: Sep. 6, 2022

(54) HOUSING CASE FOR CRYSTAL OSCILLATOR

(71) Applicant: ULVAC, INC., Kanagawa (JP)

(72) Inventors: Yuki Kaida, Kanagawa (JP); Yousuke Oguma, Kanagawa (JP)

(73) Assignee: ULVAC, INC., Kanagawa (JP)

( * ) Notice: Subject to any disclaimer, the term of this patent is extended or adjusted under 35 U.S.C. 154(b) by 57 days.

(21) Appl. No.: 17/155,766

(22) Filed: Jan. 22, 2021

(65) Prior Publication Data
US 2021/0257238 A1    Aug. 19, 2021

(30) Foreign Application Priority Data

Feb. 19, 2020  (JP) .............................. JP2020-026370

(51) Int. Cl.
*H01L 21/673* (2006.01)
(52) U.S. Cl.
CPC .............................. *H01L 21/67386* (2013.01)
(58) Field of Classification Search
CPC ........ H01L 21/67363; H01L 21/67386; B65D 83/0454; B65D 83/0445; B65D 83/0409
USPC .......................... 206/722, 704, 533, 725, 710
See application file for complete search history.

(56) References Cited

U.S. PATENT DOCUMENTS

| | | | | |
|---|---|---|---|---|
| 3,085,679 A * | 4/1963 | Burrell ............... | B65D 83/0454 | 206/533 |
| 3,870,192 A * | 3/1975 | Haley .................. | A61J 7/0084 | 206/533 |
| 5,154,296 A * | 10/1992 | Cutler ................ | B65D 83/0454 | 206/536 |
| 5,775,536 A * | 7/1998 | Lambelet, Jr. ..... | B65D 83/0454 | 221/25 |
| 6,991,110 B2 | 1/2006 | Flynn et al. | | |
| 9,422,101 B2 * | 8/2016 | Wu .................... | B65D 73/0092 | |
| 10,093,469 B2 * | 10/2018 | Dorr .................. | B65D 73/0014 | |
| 10,263,230 B2 * | 4/2019 | Dorr ...................... | B65D 79/02 | |
| 10,772,794 B2 * | 9/2020 | Swegle ................ | A61J 1/1425 | |
| 2005/0205595 A1 * | 9/2005 | Lepke ..................... | G07F 11/54 | 221/87 |
| 2015/0284174 A1 * | 10/2015 | Vogels ............... | B65D 83/0454 | 221/69 |

FOREIGN PATENT DOCUMENTS

JP           3953505 B2     8/2007

* cited by examiner

*Primary Examiner* — Chun Hoi Cheung
(74) *Attorney, Agent, or Firm* — Cermak Nakajima & McGowan LLP; Tomoko Nakajima

(57) ABSTRACT

A housing case for a crystal oscillator monitors a film thickness of a thin film to be formed on a surface of the crystal oscillator, the monitoring being performed by measuring a resonance frequency during film formation in a vacuum atmosphere. The housing case has: a case main body having disposed on an upper surface thereof a plurality of first recessed parts each being capable of housing therein a crystal oscillator in a horizontal posture with a main surface thereof facing in an up-and-down direction; a first cap body detachably mounted on the case main body from an upper side thereof; and an engaging means for engaging the first cap body relative to the case main body. The engaging means is so constructed and arranged that, in a state in which the first cap body is engaged with the case main body, the crystal oscillators housed in the first recessed parts are restrained from jumping out of position.

4 Claims, 5 Drawing Sheets

HOUSING CASE FOR CRYSTAL OSCILLATOR

This application claims priority under 35 U.S.C. § 119 to Japanese Patent Application No. 2020-026370, filed Feb. 19, 2020, which is incorporated by reference.

TECHNICAL FIELD

The present invention relates to a housing case for crystal oscillators each being adapted for use in monitoring a film thickness of a thin film to be formed on a surface of each of the crystal oscillators, the monitoring being carried out by measuring the resonance frequency during the film formation in a vacuum atmosphere. This invention relates in particular to an arrangement in which the crystal oscillators can be easily set in position (transferred) into a holder of a sensor head of a crystal oscillator type of film thickness monitor.

BACKGROUND ART

At the time of forming a predetermined thin film on a substrate as an object for forming a film thereon, e.g., by vacuum deposition method, a crystal oscillator type of film thickness monitor is generally used for monitoring the film thickness of a vapor deposition material that has been adhered to the substrate. This kind of crystal oscillator type of film thickness monitor is known in, e.g., patent document 1 (Japanese Patent Gazette P3953505). The film thickness monitor in question has a sensor head. The sensor head is provided with: a sensor head main body having a driving means such as a stepping motor (vacuum pulse motor) and the like; and a holder in which a plurality of crystal oscillators are disposed on an imaginary circle at a distance from one another so as to be driven for rotation by a driving means. Provided that the direction from the sensor head main body to the holder is defined to be upper, on an upper surface of the holder having disposed each of the crystal oscillators, there is disposed a mask body in a manner to cover the holder. At a predetermined position of the mask body there is opened a film-forming window which faces the main surface (the surface to which the deposited material gets adhered) of a single crystal oscillator.

At the time of film forming processing in the vacuum atmosphere, the thickness of a thin film to be formed on the main surface of the crystal oscillator is monitored through the film-forming window by measuring the resonance frequency of the crystal oscillator. Then, for example, when the measured resonance frequency varies beyond a predetermined range as a consequence of an increase in the thickness of the thin film to be formed, the crystal oscillator in use is judged to be the end of lifetime. When the crystal oscillator in use as a monitor has reached the end of the lifetime, the holder is rotated by the stepping motor to the phase in which the next crystal oscillator and the film-forming window come into vertical agreement with each other. When all of the crystal oscillators that are disposed in the holder of the sensor head have reached the end of the lifetime by repeating the above-mentioned operations, the film-forming operations are suspended, and an operator in charge removes the holder, in the atmospheric conditions, off from the sensor head main body so that each of the crystal oscillators is replaced. The crystal oscillators of this kind will ordinarily be carried in a state of being housed in a specialized housing case.

Such a housing case for a plurality of crystal oscillators as is arranged to be capable of holding a plurality of crystal oscillators is known, e.g., in patent document 2 (U.S. Pat. No. 6,991,110). This housing case has: a case main body (tray portion) in cylindrical shape; and a cap body (cover portion) which is rotatably mounted on the case main body from an upper side thereof. On an upper periphery of the case main body there are formed in a recessed manner a plurality of supporting slots (housing or containing parts) at a circumferentially predetermined distance from one another. Then, crystal oscillators each having a circular profile are housed into each of the supporting slots from an upper side in a vertical posture in which the main surface of the crystal oscillator is at right angles to the vertical direction. In this manner, the crystal oscillators are arranged to be supported only by the respective outer peripheries.

The cap body is provided with a slot opening which is vertically in alignment (i.e., in alignment in the vertical direction) with any one of the supporting slots. It is thus so arranged that a single crystal oscillator that is housed in one of the supporting slots can be picked up (or removed) by using a pickup tool such as a pair of tweezers and the like. In the above-mentioned known art, however, when the operator tries to pick up a crystal oscillator from the supporting slot by using the pickup tool, it is necessary to pinch with the pickup tool both the front surface and the rear surface, inclusive of the main surface, of the crystal oscillator. There is thus a problem in that the surfaces of the crystal oscillator are likely to be damaged by the pickup tool. In addition, in case a plurality (e.g., 12 pieces) of crystal oscillators are set in position into the holder, each of the crystal oscillators must be set one piece at a time, while picking up each of the crystal oscillators from respective supporting slots, thereby taking much time and effort.

PRIOR ART DOCUMENTS

Patent Documents

Patent Document 1: Japanese Patent Gazette P3953505
Patent Document 2: U.S. Pat. No. 6,991,110

SUMMARY OF THE INVENTION

Problems that the Invention is to Solve

In view of the above points, this invention has a problem of providing such a housing case for a crystal oscillator as is capable of suppressing to the best extent possible damages to the main surface of the crystal oscillator when it is picked up (taken out) by using a pickup tool, and as is also capable of improving the workability even at the time of setting in position a plurality of crystal oscillators into the housing case for a crystal oscillator.

Means for Solving the Problems

In order to solve the above problems, this invention is a housing case for a crystal oscillator, the crystal oscillator being adapted for use in monitoring a film thickness of a thin film to be formed on a surface of the crystal oscillator, the monitoring being performed by measuring a resonance frequency during film formation in a vacuum atmosphere. The housing case of this invention comprises: a case main body having disposed on an upper surface thereof a plurality of first recessed parts each being capable of housing therein a crystal oscillator in a horizontal posture with a main surface of the crystal oscillator facing in an up-and-down direction, the first recessed parts being disposed on a first imaginary circle at a distance from one another; a first cap body detachably mounted on the case main body from an upper side thereof; and an engaging means for engaging the first cap body relative to the case main body, wherein the engaging means is so constructed and arranged that, in a state in which the first cap body is engaged with the case main body, the engaging means restrains the crystal oscillators housed in the first recessed parts from jumping out of position.

According to this invention, each of the crystal oscillators is housed in a horizontal posture in each of the first recessed parts disposed on an upper surface of the case main body. Therefore, in case the operator in charge removes the first cap body in order to pick up a single crystal oscillator that is housed in the first recessed part, the outer periphery of the crystal oscillator can be pinched with a pickup tool such as a pair of tweezers and the like. In this manner, the main surface of the crystal oscillator can be suppressed, to the best extent possible, from getting damaged. In addition, at the time of carrying or transporting the crystal oscillators, the first cap body is engaged with the case main body by the engaging means. In this state, jumping out of the crystal oscillators can be restrained, e.g., by such a surface of the first cap body as lies opposite to the upper surface of the case main body in which a plurality of first recessed parts are formed. As a result, there will occur no disadvantage in that the crystal oscillators get damaged due to the vibrations and the like at the time of carrying them. By the way, in this invention, the description of "the crystal oscillators are housed in a horizontal posture" includes not only the case in which the crystal oscillators are, in the strict sense, in parallel with the horizontal surface when the case main body is installed on the horizontal surface, but also the case in which the crystal oscillators are housed in a state of inclination relative to the horizontal surface.

In this invention, the housing case for a crystal oscillator preferably comprises second recessed parts smaller in area than that of the first recessed parts, the second recessed parts being disposed around, and in continuation to, the first recessed parts. According to this arrangement, at the time when the operator tries to pinch the outer periphery of the crystal oscillators with a pickup tool such as a set of tweezers and the like, the second recessed parts serve the purpose of receiving the front end portion of the pickup tool without the contact of the pickup tool with the crystal oscillators. It is thus possible to further restrain damaging to the main surface of the crystal oscillators. By the way, each of the second recessed parts can be provided in two pieces symmetrically around the first recessed part. Alternatively, it may, for example, be so arranged that a single second recessed part may uniformly be provided on the diametrically inside or the outside of each of the first recessed parts. In this case, in order to downsize the housing case, preferably, each of the second recessed parts shall be provided only on the diametrically inside of each of the first recessed parts. On the other hand, for example, the second recessed parts may be positioned on the first imaginary circle. At this time, it may be so arranged that the adjacent first recessed part and the second recessed part are brought into communication with each other (in other words, by means of an annular groove by which the first recessed groove and the second recessed groove are circumferentially in communication with each other). Otherwise, the diameter of the first recessed part may be dimensioned to be able to accept the front end portion of the pickup tool and, by cutting away outer periphery as described hereinafter, the second recessed part may be formed.

Further, in this invention, an arrangement may be employed such that a supporting piece may be formed in each of the first recessed parts, the supporting piece being adapted to support such a crystal oscillator at an outer periphery thereof as has been dropped into the first recessed part from an upper side. According to this arrangement, the main surface and the rear surface of the crystal oscillator can advantageously be suppressed from getting damaged by the vibrations and the like at the time of carrying the crystal oscillator. In this case, an arrangement may be made such that the horizontal movement of the crystal oscillator that has been dropped from the upper side into the first recessed part can be restrained by the supporting piece. On the other hand, an arrangement may be made that, when the supporting piece supports the outer periphery of a crystal oscillator that has been dropped from an upper part into the first recessed part, the horizontal movement of the crystal oscillator is restrained by an inner surface of the first recessed part (or by another element formed on the inner surface thereof).

In addition, in this invention, the housing case for the crystal oscillator may comprise: a second cap body that can be detachably inserted, from an upside, into the case main body prior to insertion of the first cap body into the case main body. The second cap body has formed, in such a surface thereof as lies opposite to an upper surface of the case main body, a pickup opening that faces any one of the first recessed parts so as to enable to pick up a crystal oscillator housed in the first recessed part. According to this arrangement, when a single crystal oscillator that has been housed in the first recessed part is picked up, there can be maintained a state in which each of the other crystal oscillators housed in other first recessed parts is restrained from jumping out of position. Therefore, at the time when the operator picks up a single crystal oscillator, there can be avoided a disadvantage in that other crystal oscillators are damaged by mistake.

Further, the housing case preferably further comprises a holder of a sensor head for monitoring a film thickness of a crystal oscillator, the holder being provided with installation recessed parts in which a plurality of crystal oscillators are installed on a second imaginary circle with a center thereof being the center of rotation, at a distance from one another, the holder being arranged to set in position unused crystal oscillators. Provided that the holder has formed, on a surface of installing crystal oscillators, a boss part having an axial line passing through the center of rotation, the first cap body has: on an upper surface thereof a fitting recessed part in which the boss part gets fitted so as to coaxially coincide the first imaginary circle and the second imaginary circle; and a phase determining means for determining the phase of the first cap part relative to the holder such that the first recessed part and the installation recessed part vertically coincide with each other.

According to the above-mentioned arrangement, when all of the crystal oscillators placed in the sensor head have reached the end of the lifetime, the operator takes out the holder from the sensor head main body so that each of the used crystal oscillators is removed out of the holder. Then, after having taken out the first cap body (when the second cap body is present, both the first and the second cap bodies) from the case main body, the holder is set in position from an upper side thereof while fitting the boss part into the fitting recessed part. At this time, by means of the phase determining means, the first recessed part and the fitting recessed part are brought into a posture of vertically coinciding with each other. Then, by turning the holder and the case main body integrally upside down, each of the crystal oscillators housed in the first recessed part is transferred to the installation recessed part. Finally, after lifting upward the case main body on the holder for separation, the holder will be installed once again on the sensor head main body. As described above, according to this invention, without particularly using a pickup tool such as a pair of tweezers, and the like, a plurality of crystal oscillators housed in the case main body can be set in position (transferred) respectively into the installation recessed parts at a single processing. As a result, as compared with the arrangement in the above-mentioned known art, the workability can be dramatically improved. Still furthermore, there will be no disadvantage such as damaging the main surface of the crystal oscillator.

MODES FOR CARRYING OUT THE INVENTION

With reference to the drawings, a description will be made of a housing case for crystal oscillators taking as an example an arrangement suitable for a crystal oscillator type of monitor having a sensor head in which twelve crystal oscillators of a circular contour can be placed in position in a holder. In the following description, the terms denoting the directions such as up, down and the like shall be based on the posture in FIG. 1. By the way, as to the crystal oscillator Cy, material and elements for measuring the resonance frequency of the crystal oscillator, those of known art may be used. Therefore, further details thereof inclusive of a concrete method for measuring by a film thickness monitor will be omitted.

Figure 1:
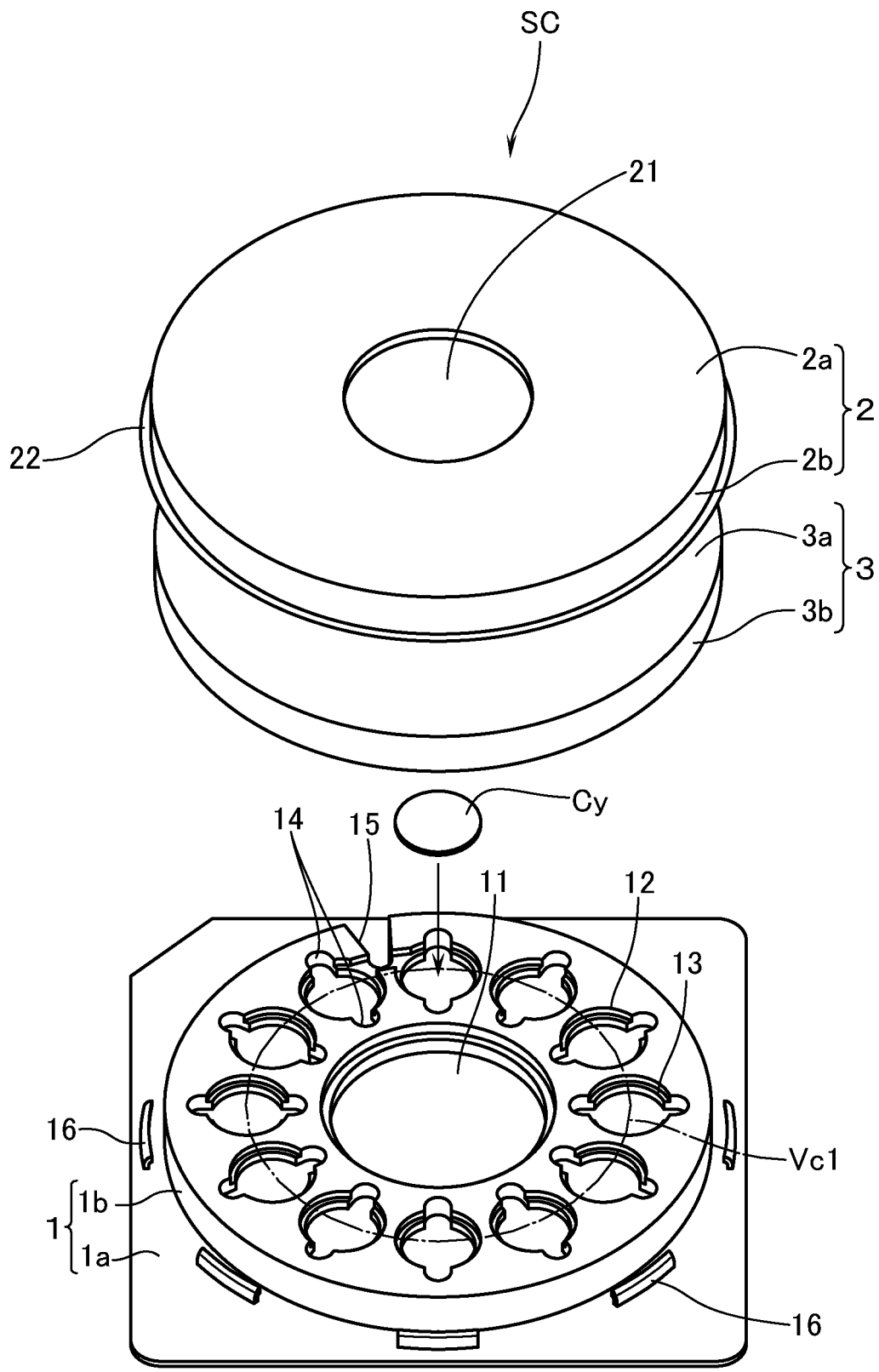
FIG. 1 is an exploded perspective view showing a housing case for a crystal oscillator according to an embodiment of this invention.
Figure 2:
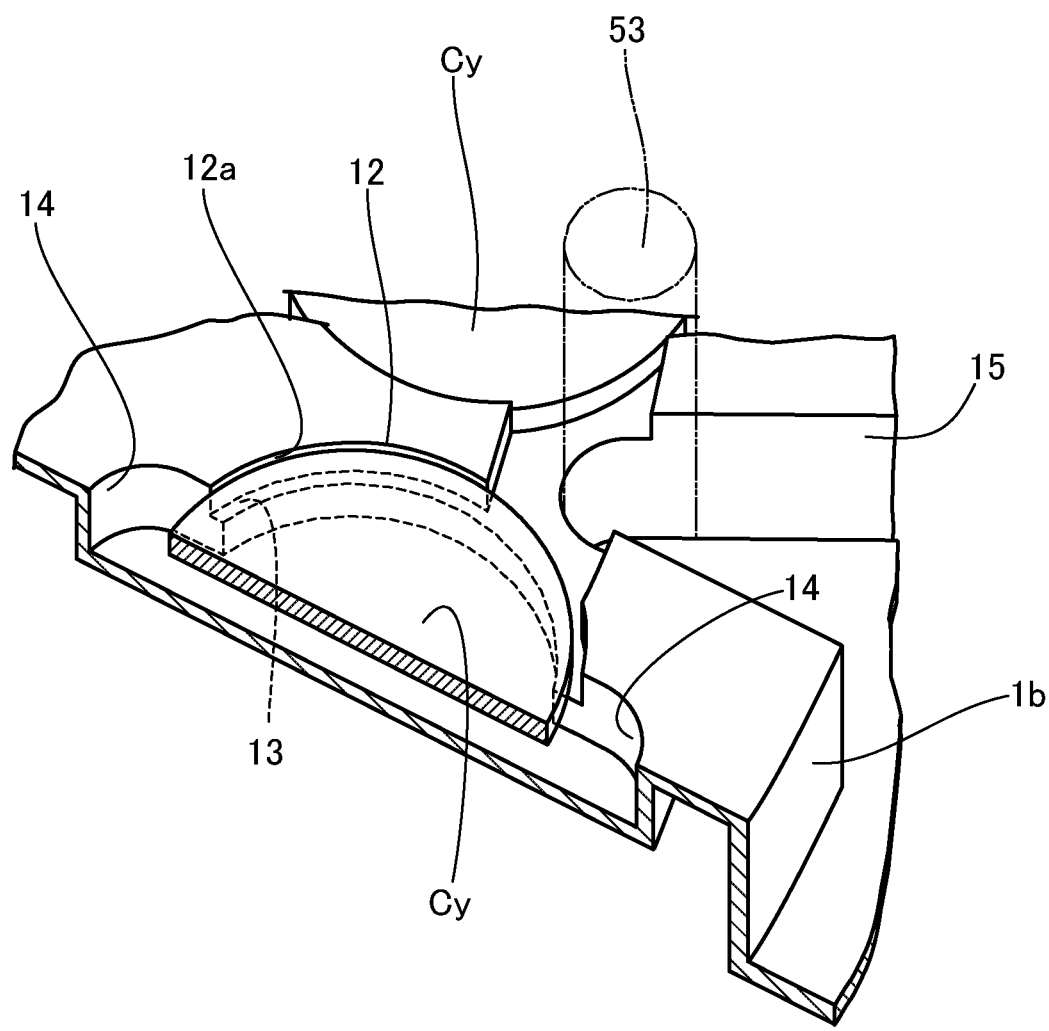
FIG. 2 is a partial perspective view showing in enlargement the supporting conditions of the crystal oscillator in the first recessed part of the housing case.
Figure 3:
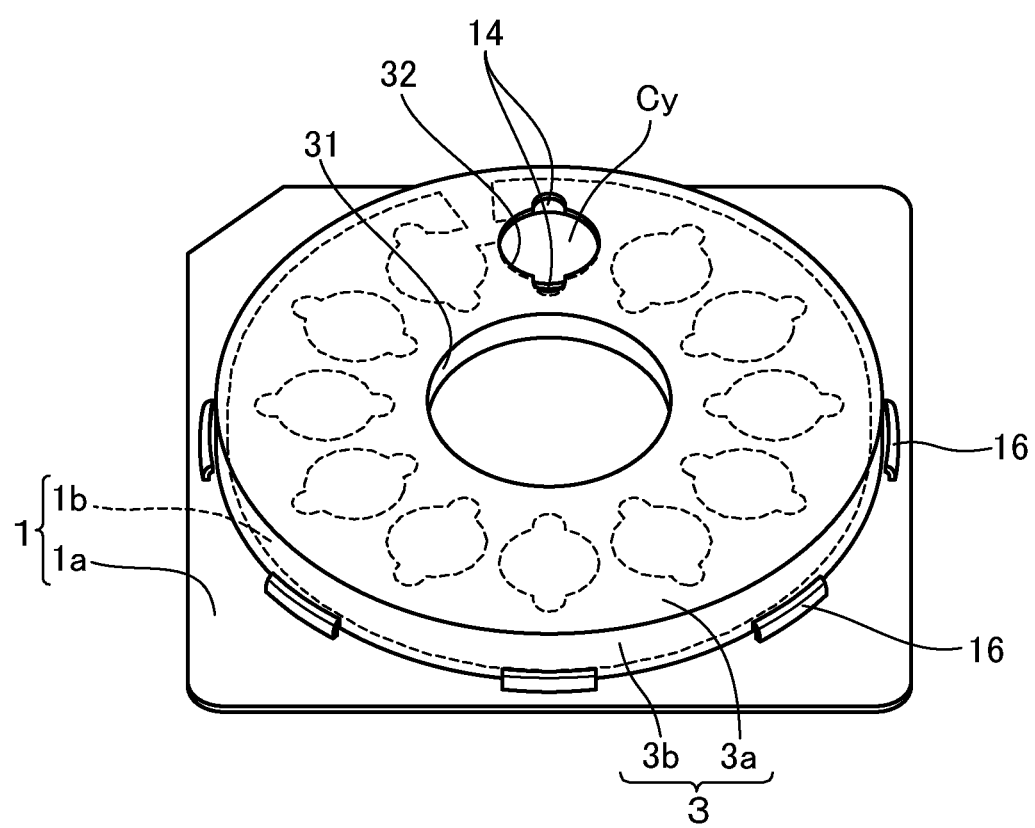
FIG. 3 is a perspective view of the housing case in a state in which the first cap body has been removed.

With reference to FIGS. 1 to 3, reference character SC denotes a housing case for crystal oscillators according to this embodiment, having a case main body 1, a first cap body 2, and a second cap body 3. The case main body 1 is made, e.g., of a synthetic resin and is made up of; a base plate part 1a having a substantially square contour; and a seating part 1b, in cylindrical shape, which is disposed on an upper surface of the base plate part 1a. On an upper surface of the seating part 1b, there is provided a fitting recessed part 11 of a circular contour positioned in the central part thereof. It is thus so arranged that boss part of the sensor head or projected part of the cap body, to be described hereinafter, can be fitted into the fitting recessed part 11. The upper surface of the seating part 1b also has first recessed parts 12 each having a contour equivalent to the crystal oscillator Cy and being capable of housing the crystal oscillator Cy in a horizontal posture in which the main surface of the crystal oscillator Cy faces the up and down (vertical) direction. The first recessed parts 12 are disposed in number coinciding with the number of the crystal oscillators to be disposed (installed) in the sensor head, and are provided on a first imaginary circle Vc1 which is formed about a hole axis of the fitting recessed part 11 serving as the center at a predetermined distance from one another. In this case, the first imaginary circle Vc1 is formed so as to coincide with a second imaginary circle Vc2.

An erected wall part 12a of the first recessed part 12 is provided, as shown in FIG. 2, with a supporting piece 13 which projects inward of the erected wall part 12a. It is thus so arranged that the crystal oscillator Cy to be dropped from an upper side of the first recessed parts 12 into each thereof can be supported by the supporting piece 13 at the outer periphery of the crystal oscillator Cy. In this case, in a state in which the crystal oscillator Cy is supported by the supporting piece 13 at the outer periphery of crystal oscillator Cy, the horizontal movement of the crystal oscillator Cy can be restrained by the inner surface of the erected wall part 12a. In addition, in a state in which the crystal oscillator Cy is supported by the supporting piece 13, the upper surface of the crystal oscillator Cy is arranged, in its height, to be slightly lower than the upper surface of the case main body 1. On the upper surface of the seating part 1b there are disposed symmetrically two second recessed parts 14 around the first recessed part, the second recessed parts 14 each being smaller in diameter (smaller area) than the first recessed parts 12, the second recessed parts 14 being disposed continuously around the respective first recessed parts 12. In this embodiment, each of the second recessed parts 14 is arranged so as to form a pair respectively by the diametrically inside and the diametrically outside of the first recessed parts 12. It is to be noted that the description is being made of an example in which two second recessed parts 14 are disposed but that this invention shall not be limited to the above. Although not explained by illustration, one second recessed part 14 may be disposed exclusively on the diametrically inside or diametrically outside. In this case, in order to downsize the housing case SC, each of the second recessed part 14 shall, preferably, be disposed only on the diametrically inside of each of the first recessed parts 12. On the other hand, it is also possible, for example, to dispose the second recessed parts 14 on the first imaginary circle Vc1. At this time, it may be so arranged that the adjoining first recessed parts 12 may be brought into communication with each other through the second recessed part 14 (in other words, in the form of annular groove in which each of the first recessed parts 12 and the second recessed parts 14 are circumferentially in communication with each other).

On the outer periphery of the seating part 1b there is formed a notched groove 15 which is diametrically recessed inward. It is thus so arranged that, when the pin member to be disposed in the sensor head (to be described hereinafter) gets engaged with the notched groove 15, the case main body 1 can be positioned in phase relative to the sensor head. In this embodiment, this notched groove 15 and the pin member constitute a phase determining means. The second cap body 3 which serves the purpose of an inner lid is made of a synthetic resin which is provided with a lid plate part 3a of a disk shape and a peripheral wall part 3b, in cylindrical shape, which is vertically disposed from an outer periphery of the lid plate part 3a. In the central part of the lid plate part 3a, as shown in FIG. 3, there is formed a projected part 31 which is capable of being fitted into the fitting recessed part 11 of the case main body 1. It is thus so arranged that, from an upper side of the seating part 1b of the case main body 1 with the lid plate part 3a lying on the upper side, the projected part 31 can be detachably mounted on the seating part 1b while fitting the projected part 31 into the fitting recessed part 11. In this case, the external dimensions of the second cap body 3 are set not to impede the rotation of the second cap body 3 about a hole axis of the fitting recessed part 11 of the second cap body 3 in a state in which the projected part 31 remains fitted into the fitting recessed part 11. The lid plate part 3a of the second cap body 3 has also formed therein a pickup opening 32 which has a contour in which the first recessed part 12 and the second recessed part 14 are combined together and, in a state of being fitted into the seating part 1b, each of the crystal oscillators Cy housed in the respective first recessed parts 12 faces the pickup opening 32.

The first cap 2 which serves the purpose of an outer lid, is made of a synthetic resin provided, in a manner similar to the second cap body 3, with a disk-shaped lid plate part 2a and a peripheral wall part 2b, in cylindrical shape, which is vertically disposed from an outer periphery of the lid plate part 2a. In the central part of the lid plate part 2a there is formed a projected part 21 which is capable of fitting, in the presence of the second cap body 3, with the inner space of the projected part 31 and, in the absence of the second cap body 3, with the fitting recessed part 11 of the case main body 1. Then, with the lid plate part 2a lying on the upper side, from the upper side of the seating part 1b of the case main body 1, the projected part 21 is detachably fitted into the seating part 1b while fitting the projected part 21 into the fitting recessed part 11 and into the inner space of the projected part 31 of the second cap body 3, thereby covering the upper surface and the peripheral wall of the seating part 1b.

Figure 4:
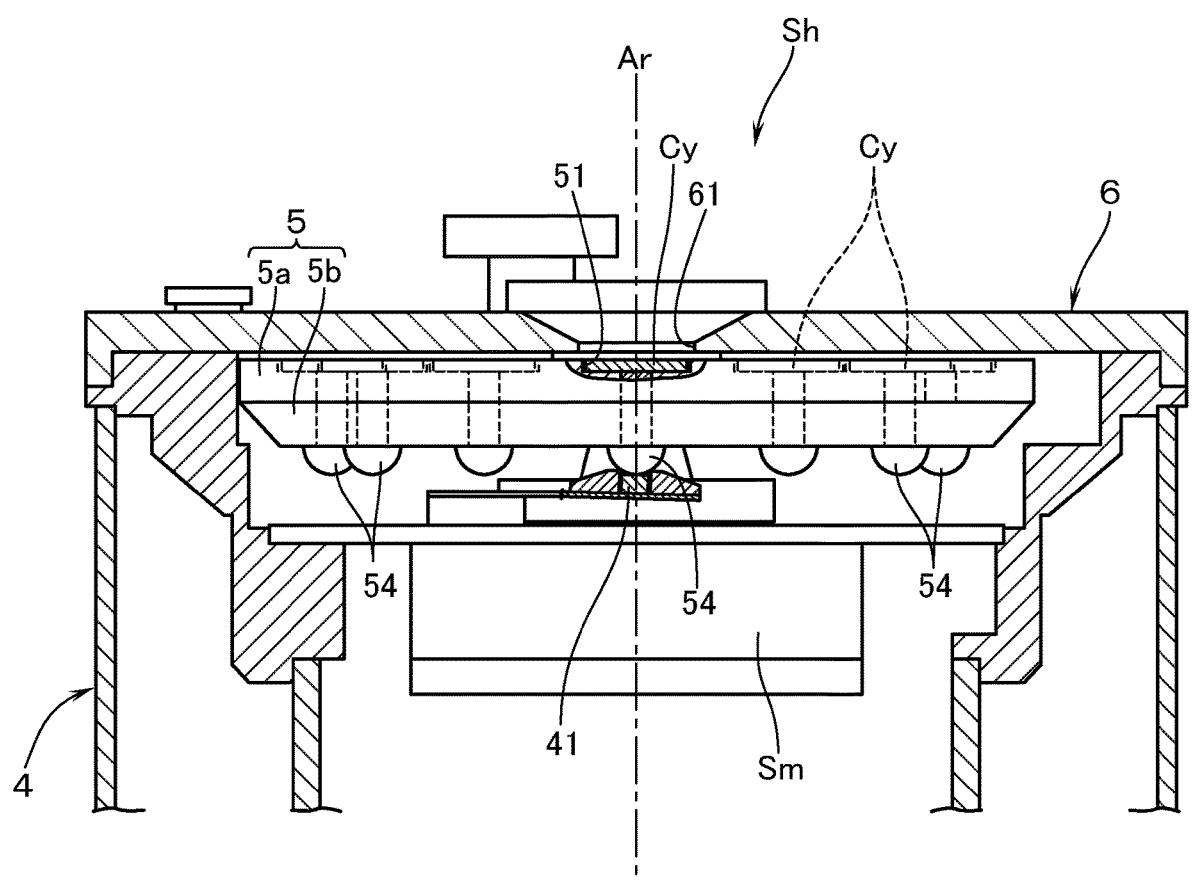
FIG. 4 is a partial sectional view showing a sensor head of a crystal oscillator type of film thickness monitor.
Figure 5A:
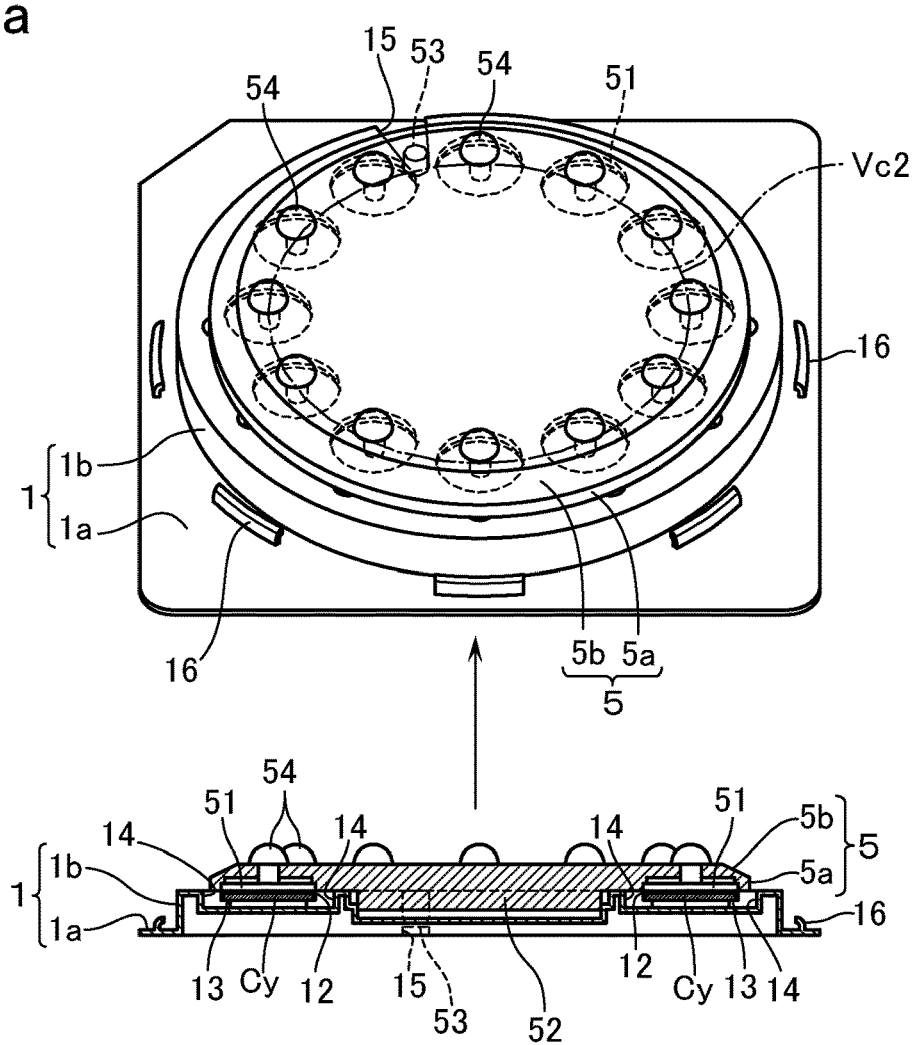
FIG. 5A and FIG. 5B are sectional views to explain the transferring of the crystal oscillator from the housing case to the holder of the sensor head.
Figure 5B:
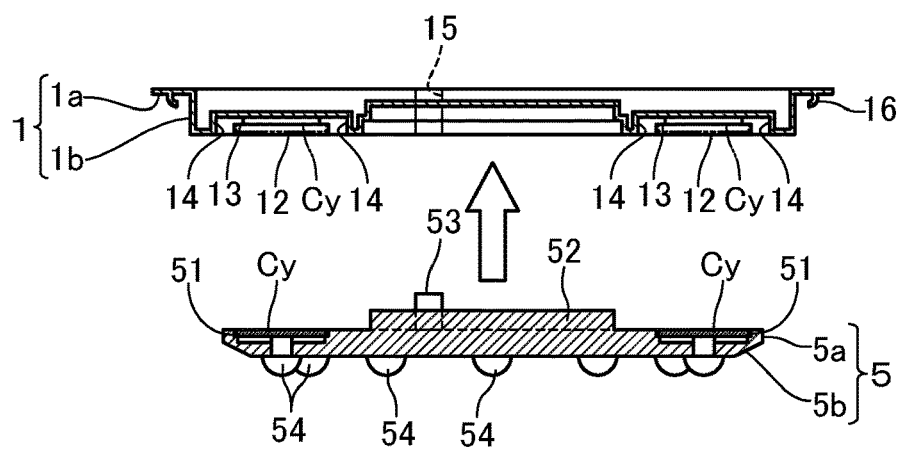

At the lower end part of the peripheral wall part 2b, there is provided a projected strip 22 which is projected outward of the peripheral wall part 2b. On the upper surface of the base plate part 1a there are provided a plurality of engaging projections 16 so as to be engaged with the projected strip 22. Then, the first cap body 2 is mounted on the peripheral wall part 2b of the case main body 1 from the upper side of the seating part 1b of the case main body 1 with the lid plate part 2a lying on the upper side. By pushing the first cap body 2 downward, the projected strip 22 gets engaged with the engaging projections 16. In this state, the jumping out of the crystal oscillators Cy housed in the first recessed parts 12 can be restrained: by the inner surface of the lid plate part 3a in the presence of the second cap body 3, by pushing the lid plate part 3a of the second cap body 3 toward the upper surface of the peripheral wall part 2b; and by the inner surface of the lid plate part 2 of the first cap body 2 lying opposite to the upper surface of the case main body 1 in the absence of the second cap body 3. With reference also to FIG. 4 and FIG. 5, a description will now be made of a procedure of setting each of crystal oscillators Cy housed in the housing case SC, into the sensor head Sh of a crystal oscillator type of film thickness monitor.

The sensor head Sh of a crystal oscillator type of film thickness monitor is made up as shown in FIG. 4 of: a sensor head main body 4 in which a stepping motor Sm is disposed and electrodes 41 are provided; a holder 5 in which a plurality of crystal oscillators Cy are disposed and is driven for rotation by the stepping motor Sm; and a mask 6 which is attached to the sensor head main body 4 in a manner to cover the upper surface of the holder 5 on which each of the crystal oscillators Cy is disposed and, at the same time, which is provided with a film-forming window 61 to which faces any one of single crystal oscillators Cy.

The holder 5 has: a holding plate part 5a which is made of stainless steel and which is provided with an installation recessed part 51 in which are mounted twelve crystal oscillators Cy on a second imaginary circle Vc2 at a predetermined distance from one another, with the rotary axis Ar (center of rotation) of the stepping motor Sm serving as the center; and a ring plate part 5b made of a fluorocarbon resin and is integrally fixed to a lower surface of the holding plate part 5a. It is thus so arranged that the holder 5 can be detachably disposed at a predetermined position of the sensor head main body 4. Further, on an upper surface (the surface on which the crystal oscillators Cy are installed) of the holding plate part 21, there is formed a boss part 52 having an axial line passing through the center of rotation. In a predetermined position therearound, a pin member 53 is vertically disposed. In addition, in the holding plate part 5a there is held a vane type of electrode 54 in electrical communication with a crystal oscillator Cy that is respectively housed in the installation recessed part 51 so as to be in electrical communication as a result of contact of the vane type electrode 54 with the electrode 41. It is to be noted that the sensor head Sh described herein relates one example and that there may be used a known one having a plurality of installation recessed parts 51 in which crystal oscillators Cy are installed at a predetermined distance from one another on the second imaginary circle Vc2. Therefore, further description is omitted.

In a state in which new (not used) crystal oscillators Cy are housed respectively inside the first recessed parts 12 with the main surface of each of the crystal oscillators facing upward (or downward), the housing case SC will be that, while fitting the projected part 31 of the lid plate part 3a into the fitting recessed part 11, the second cap body 3 is fitted. Thereafter, the projected part 21 of the lid plate part 2a is fitted into the inner space of the projected part 31 of the second cap body 3 and, at the same time, the projected strip 22 is engaged with engaging projection 16 into the state in which the cap body 2 is mounted. In this state the housing case SC will be carried out. When the operator replaces the crystal oscillator Cy that has been set in position in the holder 5, the holder 5 is taken out of the sensor head main body 4 and each of the used crystal oscillators Cy is removed out of the holder. As to the housing case SC, after having removed the first cap body 2 and the second cap body 3 from the case main body 1 in the order mentioned, in a posture in which the first recessed part 12 having housed therein the crystal oscillators Cy look upward, the case main body 1 is placed on a horizontal table (not illustrated). In concrete, in case the first cap body 2 is taken out of the case main body 1, the operator pushes with his fingers the outer surface of the peripheral wall part 2b. The projected strip 22 is thus moved inward (toward the center of the first imaginary circle Vc1) of the position of engagement with the engaging projection 16 so that the peripheral wall part 2b of the first cap body 2 is deformed into an opposing position incapable of being engaged with each other. Thereafter, the peripheral wall part 2b is deformed to a further upward position (toward a departing direction in the opposing position of the first cap body 1 and the peripheral wall part 2). After having moved the projected strip 22 to a position above the engaging projection 16, the operator slowly releases the deforming force toward the peripheral wall part 2b by his fingers.

Suppose that the above-mentioned procedure has been performed only on one of the plural engaging projections 16. Those portions of the projected strip 22 corresponding to both sides of the engaging projection 16 that has been released remain engaged with the relevant engaging projections 16. Therefore, when the deforming force is slowly released with the fingers, the position of the corresponding projected strip 22 in question will remain stable around an upper position of the outer periphery of the engaging projections 16. By repeating the above procedure and, as a result of moving the entire length of the projected strip 22 from the position of engagement with each of the engaging projections 16 to another position, the first cap body 2 will be ready to be released from the position of engagement with the case main body 1. By the way, since the engagement of both is released by deforming the first cap body 2 with the fingers of the operator, there is a possibility that the operator may perform the operation of releasing the deforming force in a shocking manner. This shock is transmitted from the case main body 1 to the crystal oscillators Cy housed inside the first recessed parts 12, and will be a cause for releasing of the crystal oscillators Cy out of the first recessed parts 12. However, since the second cap body 3 is in a state of being engaged in the normal position by the first cap body 2, the releasing of the crystal oscillators Cy can be prevented.

On the other hand, the method of engaging the first cap body 2 with the case main body 1 can be performed in the following manner. In other words, although not described by particularly illustrating, a spiral groove is formed, e.g., in one of the inner surface of the peripheral wall 2b of the first cap body 2 and the outer surface of the seating part 1b of the case main body 1, and a projection (or projected ridge) is formed in the other thereof so as to be spirally engaged with each other. Otherwise, both the inner surface of the peripheral wall 2b of the first cap body 2 and the outer periphery of the seating part 1b of the case main body 1 are formed oblong as seen from the top. Then, an engaging method by making use of a physical law of wedge can be materialized. According to this arrangement, as a result of relative rotation of the case main body 1 and the first cap body 2, both can be fixed or released by relative rotation through wedge effect. A slight shock may be anticipated at the time of releasing from the fixing with wedge but, as compared with the fact that the direction of disengagement of the projected strip 22 and each of the engaging projections is in the vertical direction relative to the crystal oscillators Cy, the shocks at the time of releasing by rotation are in the direction of the imaginary circle. The construction will thus be that the shocks can be accepted by the erected wall part 12a of the first recessed part 12. As a consequence, the second cap member 3 can be done away with. Then, the holder 5, from which each of the used crystal oscillators Cy has been removed, is disposed on the case main body 1 from the upper side of the case main body 1, while fitting the boss part 52 into the fitting recessed part 11 (see FIG. 5A). At this time, by inserting the pin member 53 into the notched groove 15 of the case main body 1, the holder 5 can be positioned in phase relative to the case main body 1. A posture can thus be assumed in which each of the of the first recessed parts 12 and each of the installation recessed parts 51 that make the first imaginary circle and the second imaginary circle concentrically coincide with each other.

Then, after having lifted the holder 5 and the case main body 1 from the table, the operator turns them integrally upside down. As a result of these operations, each of the crystal oscillators Cy housed in the first recessed parts 12 is positionally transferred to the respective installation recessed parts 51 of the holder 5. At this time, the case main body 1 is manufactured with the following dimensional tolerance: i.e., that the range of regulation of the crystal oscillators Cy by the installation recessed parts 51 and the erected wall parts 12a substantially coincides with each other; and that the clearance at the wall surface parts of the installation recessed parts 51 corresponding to a plurality of erected wall parts 12a becomes less than the thickness of the crystal oscillator Cy (if the case main body 1 is not manufactured at the above-mentioned dimensional tolerance, there is a possibility that the crystal oscillator Cy may get stuck in the clearance in question, whereby the crystal oscillators cannot be transferred). Further, as to the regulation by the erected wall part 12a, in a sense of regulating the positional range of the crystal oscillators Cy, three points (three erected wall surfaces) or more will serve the purpose. Therefore, there is no need of the sectional shape of the first recessed part 12 to be circular. Although not described by particularly illustrating, the following arrangement may also be employed, e.g.: all of the plurality of first recessed parts 12 are communicated with one another into an annular groove; and only the movement direction of the crystal oscillators Cy on the first imaginary circle Vc1 may be regulated by the supporting pieces on the outer periphery that are present in the first recessed part 12. In this case, the condition will be that the inner and outer circles constituting the annular groove must be coaxial (copying operation permitting condition), and therefore the regulation by the supporting pieces must be arranged to regulate these two directions. As another arrangement, the following arrangement is also possible, i.e., that the plurality of first recessed parts 12 may be constituted into a shape in which the outer circle and the inner circle that constitute the annular groove are divided at an equal angle (so-called cake-cutting) depending on the number of crystal oscillators Cy that are going to be installed in the circles (at this time, the center side will be left open and only the outer circle can be divided into a stipulated equiangular donut divisions). In this case, such a remainder of the first recessed part 12 as does not overlap with the circle of the crystal oscillators Cy, constituting the three-point positional regulation, can be used as the second recessed parts.

Finally, after having lifted upward the case main body 1 out of the holder 5, the holder 5 will be inserted again into the sensor head main body 4 while keeping this posture. As described, according to this embodiment, without particularly using the pickup tool such as a pair of tweezers (not illustrated), twelve crystal oscillators Cy to be housed in the case main body 1 can be respectively set in position into the installation recessed parts 51 of the holder 5 in a single operation. As a result, when compared with the known art example, the workability can dramatically be improved. In addition, there occurs no disadvantage in that the main surfaces of the crystal oscillators Cy are damaged. On the other hand, in case the operator replaces only a single crystal oscillator Cy in the housing case SC, the first cap body 2 is picked up (taken out) from the case main body 1. Then, the second cap body 3 is appropriately rotated about the opening axis of the fitting recessed part 11, and the first recessed part 12 that houses therein a non-used crystal oscillator Cy and the pickup opening 32 are made to vertically coincide with each other. In this state, after inserting the front end part of the pickup tool such as a pair of tweezers into the second recessed part 14, the outer periphery of the crystal oscillator Cy is pinched to thereby pick it up out of the first recessed part 12. Then, in a state of pinching with the pickup tool, the crystal oscillator is set in position into the installation recessed part 51 and the like.

According to the above-mentioned embodiment, each of the crystal oscillators Cy is housed, in a horizontal posture, in each of the first recessed parts 12 disposed on the upper surface of the case main body 1. Therefore, in case the operator picks up the first cap body 2 to pick up, through the pickup opening 32 of the second cap body 3, a single crystal oscillator Cy that is housed in the first recessed part 12, the second recessed parts 14 serve the purpose of accepting the front end part of the pickup tool so that the front end part does not contact the crystal oscillator Cy. At the same time, since the outer periphery of the crystal oscillator Cy can be pinched by the pickup tool, the main surface of the crystal oscillator Cy can be prevented from getting damaged to the best extent possible. In addition, at the time of carrying, the first cap body 2 can be engaged with the case main body 1. In this state, the jumping out of the crystal oscillators Cy can be suppressed by the surfaces of the first cap body 2 and the second cap body 3 that lie opposite to the upper surface of the case main body 1. Therefore, there occurs no disadvantage in that the crystal oscillators Cy will get damaged due to the vibrations and the like at the time of carrying. Further, the crystal oscillators Cy that have been dropped from the upper side into the first recessed parts 12 are supported at the outer periphery thereof by the supporting pieces 13. Therefore, the main surfaces and the rear surfaces of the crystal oscillators Cy can be restrained from getting damaged due to the vibrations and the like at the time of carrying. In addition, due to the presence of the second cap body 3, at the time of picking up a single crystal oscillator Cy that is housed in the first recessed part 12, each of the crystal oscillators Cy housed in the first recessed part 12 other than the above can be maintained in the state of restraining the jumping out. Therefore, at the time when the operator picks up a single crystal oscillator Cy, possible disadvantage in that the other crystal oscillators Cy will be damaged by mistake can be eliminated.

Descriptions have so far been made of embodiments of this invention, but various modifications will be available as long as the technical idea of this invention is not deviated. In the above-mentioned embodiments, descriptions have been made of an example having a second cap body 3 on the assumption that the crystal oscillators Cy are taken out one by one. However, in case the housing case SC is for exclusive use of a holder of the sensor head of a particular crystal oscillator type of film thickness monitor, the second cap body 3 can be omitted. Further, in the above-mentioned embodiments, descriptions have been made of an example in which the engaging means is constituted by a projected strip 22 and the engaging projections 16 but, as long as there can be maintained a state in which the jumping out of the crystal oscillators Cy housed in the first recessed part 12 is restrained when the first cap body 2 is inserted into the case main body 1, this invention is not limited to the example in question. Further, in the above-mentioned embodiments, descriptions have been made of an example in which, by making use of the boss part 52 and the pin member 53 disposed in the holder 5, the case main body 1 is fixed in position or in phase relative to the holder 5. However, without being limited to the above, other known means for fixing the position or phase can be used.

EXPLANATION OF REFERENCE CHARACTERS

| Cy | crystal oscillator | SC | housing case for crystal oscillator |
|---|---|---|---|
| Sh | sensor head | Vc1 | first imaginary circle |
| Vc2 | second imaginary circle | 1 | case main body |
| 11 | fitting recessed part | 12 | first recessed part |
| 13 | supporting piece | 14 | second recessed part |
| 15 | notched groove (phase determining means) | | |

-continued

EXPLANATION OF REFERENCE CHARACTERS

| 16 | engaging projection (engaging means) | | |
|---|---|---|---|
| 2 | first cap body | 22 | projected strip (engaging means) |
| 3 | second cap body | 32 | pickup opening |
| 5 | holder | 51 | installation recessed part |
| 52 | boss part | | |
| 53 | pin member (phase determining means) | | |

The invention claimed is:

1. A housing case for a crystal oscillator, the crystal oscillator being adapted for use in monitoring a film thickness of a thin film to be formed on a surface of the crystal oscillator, the monitoring being performed by measuring a resonance frequency during film formation in a vacuum atmosphere, the housing case comprising:

a case main body having disposed on an upper surface thereof a plurality of first recessed parts each being capable of housing therein a crystal oscillator in a horizontal posture with a main surface of the crystal oscillator facing in an up-and-down direction, the first recessed parts being disposed on a first imaginary circle at a distance from one another;

a first cap body detachably mounted on the case main body from an upper side thereof;

an engaging means for engaging the first cap body relative to the case main body, wherein the engaging means is so constructed and arranged that, in a state in which the first cap body is engaged with the case main body, the engaging means restrains the crystal oscillators housed in the first recessed parts from jumping out of position; and second recessed parts smaller in area than that of the first recessed parts, the second recessed parts being disposed around, and in continuation to, the first recessed parts.

2. The housing case for a crystal oscillator according to claim 1, further comprising a supporting piece formed in each of the first recessed parts, the supporting piece being adapted to support such a crystal oscillator at an outer periphery thereof as has been dropped into the first recessed part from an upper side.

3. A housing case for a crystal oscillator, the crystal oscillator being adapted for use in monitoring a film thickness of a thin film to be formed on a surface of the crystal oscillator, the monitoring being performed by measuring a resonance frequency during film formation in a vacuum atmosphere, the housing case comprising:

a case main body having disposed on an upper surface thereof a plurality of first recessed parts each being capable of housing therein a crystal oscillator in a horizontal posture with a main surface of the crystal oscillator facing in an up-and-down direction, the first recessed parts being disposed on a first imaginary circle at a distance from one another;

a first cap body detachably mounted on the case main body from an upper side thereof;

an engaging means for engaging the first cap body relative to the case main body, wherein the engaging means is so constructed and arranged that, in a state in which the first cap body is engaged with the case main body, the engaging means restrains the crystal oscillators housed in the first recessed parts from jumping out of position; and a second cap body that can be detachably inserted, from an upside, into the case main body prior to insertion of the first cap body into the case main body, wherein the second cap body has formed, in such a surface thereof as lies opposite to an upper surface of the case main body, a pickup opening that faces any one of the first recessed parts so as to enable to pick up a crystal oscillator housed in the first recessed part.

4. A housing case for a crystal oscillator the crystal oscillator being adapted for use in monitoring a film thickness of a thin film to be formed on a surface of the crystal oscillator, the monitoring being performed by measuring a resonance frequency during film formation in a vacuum atmosphere, the housing case comprising:

a case main body having disposed on an upper surface thereof a plurality of first recessed parts each being capable of housing therein a crystal oscillator in a horizontal posture with a main surface of the crystal oscillator facing in an up-and-down direction, the first recessed parts being disposed on a first imaginary circle at a distance from one another;

a first cap body detachably mounted on the case main body from an upper side thereof;

an engaging means for engaging the first cap body relative to the case main body, wherein the engaging means is so constructed and arranged that, in a state in which the first cap body is engaged with the case main body, the engaging means restrains the crystal oscillators housed in the first recessed parts from jumping out of position; and a holder of a sensor head for monitoring a film thickness of a crystal oscillator, the holder being provided with installation recessed parts in which a plurality of crystal oscillators are installed on a second imaginary circle with a center thereof being the center of rotation, at a distance from one another, the holder being arranged to set in position unused crystal oscillators, provided that the holder has formed, on a surface of installing crystal oscillators, a boss part having an axial line passing through the center of rotation, wherein the first cap body has: on an upper surface thereof a fitting recessed part in which the boss part gets fitted so as to coaxially coincide the first imaginary circle and the second imaginary circle; and a phase determining means for determining the phase of the first cap part relative to the holder such that the first recessed part and the installation recessed part vertically coincide with each other.

* * * * *